United States Patent
Li (10) Patent No.: US 12,087,737 B2
(45) Date of Patent: Sep. 10, 2024

(54) METHOD OF FORMING CHIP PACKAGE HAVING STACKED CHIPS

(71) Applicant: Yibu Semiconductor Co., Ltd., Shanghai (CN)

(72) Inventor: Weiping Li, Shanghai (CN)

(73) Assignee: Yibu Semiconductor Co., Ltd., Shanghai (CN)

( * ) Notice: Subject to any disclaimer, the term of this patent is extended or adjusted under 35 U.S.C. 154(b) by 183 days.

(21) Appl. No.: 17/535,987

(22) Filed: Nov. 26, 2021

(65) Prior Publication Data

US 2022/0173075 A1    Jun. 2, 2022

(30) Foreign Application Priority Data

Nov. 27, 2020  (CN) .......................... 202011352636.4
Nov. 27, 2020  (CN) .......................... 202011352638.3
Nov. 27, 2020  (CN) .......................... 202011359780.0

(51) Int. Cl.
*H01L 25/065*  (2023.01)
*H01L 21/56*   (2006.01)
(Continued)

(52) U.S. Cl.
CPC ........ *H01L 25/0657* (2013.01); *H01L 21/568* (2013.01); *H01L 23/3128* (2013.01);
(Continued)

(58) Field of Classification Search
CPC ... H01L 25/0657; H01L 25/50; H01L 21/568; H01L 23/3128; H01L 23/5389;
(Continued)

(56) References Cited

U.S. PATENT DOCUMENTS

2010/0133704 A1\*  6/2010  Marimuthu ......... H01L 23/3128
                                                257/E23.116
2011/0024916 A1    2/2011  Marimuthu et al.
(Continued)

FOREIGN PATENT DOCUMENTS

CN      101425510 A     5/2009
CN      104885217 A     5/2015
(Continued)

OTHER PUBLICATIONS

Shanghai Yibu Semiconductor Co., Ltd., First Office Action, CN 202011627702.4, Jul. 4, 2023, 7 pgs.
(Continued)

*Primary Examiner* — Timor Karimy
(74) *Attorney, Agent, or Firm* — USCH Law, PC (57) ABSTRACT

A method of forming a package comprises forming a stack of chip layers. Each chip layer has a front side facing away from the carrier substrate. A first chip layer includes a plurality of first chips having first chip contacts on the front side of the first chip layer and chip couplers having through vias. A second chip layer includes a plurality of second chip having second chip contacts on the front side of the second chip layer and coupled to respective ones of at least a first subset of the through vias. The method further comprises forming a redistribution layer on the front side of the first chip layer and dividing the stack of chip layers and the redistribution layer to form a plurality of chip packages. A chip package thus formed include a stack of chips and one or more chip connectors on a singulated redistribution layer.

20 Claims, 3 Drawing Sheets

(51) Int. Cl.
    *H01L 23/00*     (2006.01)
    *H01L 23/31*     (2006.01)
    *H01L 23/538*     (2006.01)
    *H01L 25/00*     (2006.01)

(52) U.S. Cl.
    CPC .......... *H01L 23/5389* (2013.01); *H01L 24/13* (2013.01); *H01L 25/50* (2013.01); *H01L 2924/15311* (2013.01); *H01L 2924/181* (2013.01)

(58) Field of Classification Search
    CPC ........... H01L 24/13; H01L 2924/15311; H01L 2924/181; H10B 80/00
    See application file for complete search history.

(56) References Cited

U.S. PATENT DOCUMENTS

| | | |
|---|---|---|
| 2014/0225273 A1 | 8/2014 | Thacker et al. |
| 2015/0108661 A1* | 4/2015 | Vincent .................. H01L 24/25 257/777 |
| 2017/0011993 A1 | 1/2017 | Zhao |
| 2017/0047308 A1 | 2/2017 | Ho et al. |
| 2019/0035761 A1 | 1/2019 | Goh et al. |
| 2019/0057940 A1 | 2/2019 | Cheah et al. |
| 2019/0067248 A1* | 2/2019 | Yoo ........................ H01L 24/13 |
| 2019/0088504 A1 | 3/2019 | Ho |
| 2020/0091123 A1 | 3/2020 | Sung |
| 2020/0203325 A1 | 6/2020 | Lee et al. |
| 2021/0125960 A1 | 4/2021 | Huang |

FOREIGN PATENT DOCUMENTS

| | | |
|---|---|---|
| CN | 104704631 A | 6/2015 |
| CN | 105118823 A | 12/2015 |
| CN | 106206458 A | 12/2016 |
| CN | 106463493 A | 2/2017 |
| CN | 107644871 A | 1/2018 |
| CN | 107818922 A | 3/2018 |
| CN | 110114874 A | 8/2019 |
| TW | 202032748 A | 9/2020 |
| TW | 202038354 A | 10/2020 |
| WO | WO2017160284 A1 | 9/2017 |

OTHER PUBLICATIONS

Shanghai Yibu Semiconductor Co., Ltd. First Office Action and Search Report, TW 110148083, Oct. 6, 2022, 12 pgs.
Weiping Li, U.S. Appl. No. 17/535,985, Non-Final Office Action issued Sep. 22, 2023.
Weiping Li, U.S. Appl. No. 17/535,984, Non-Final Office Action issued May 8, 2023.
Weiping Li, U.S. Appl. No. 17/535,984, Final Office Action issued Aug. 21, 2023.
Weiping Li, U.S. Appl. No. 17/535,984, Advisory Action dated Nov. 6, 2023.
Weiping Li, U.S. Appl. No. 17/535,984, Response to Non-Final Office Action filed Aug. 8, 2023.
Weiping Li, U.S. Appl. No. 17/535,984, Response to Final Office Action filed Oct. 23, 2023.
Weiping Li, U.S. Appl. No. 17/535,984, Examiner Interview Summary filed Nov. 3, 2023.
Weiping Li, U.S. Appl. No. 17/535,984, Notice of Allowance, issued Dec. 22, 2023.
Weiping Li, U.S. Appl. No. 17/566,661, Non-Final Office Action issued Nov. 22, 2023.
Weiping Li, U.S. Appl. No. 17/535,985, Response to Non-Final Office Action filed Dec. 22, 2023.
Shanghai Yibu Semiconductor Co., Ltd., First Office Action, CN 202011352636.4, Apr. 20, 2021, 12 pgs.
Shanghai Yibu Semiconductor Co., Ltd., Second Office Action, CN 202011352636.4, Jun. 8, 2021, 10 pgs.
Shanghai Yibu Semiconductor Co., Ltd., Third Office Action, CN 202011352636.4, Jul. 27, 2023, 9 pgs.
Shanghai Yibu Semiconductor Co., Ltd., First Office Action, TW 110144187, Apr. 21, 2022, 7 pgs.
Shanghai Yibu Semiconductor Co., Ltd., First Office Action, KR 10-2021-0163984, Sep. 5, 2023, 6 pgs.
Yibu Semiconductor (Shanghai) Co., Ltd., First Office Action, CN 202011359780.0, Apr. 22, 2021, 11 pgs.
Yibu Semiconductor (Shanghai) Co., Ltd., English Translation of First Office Action, CN 202011359780.0, Apr. 22, 2021, 13 pgs.
Yibu Semiconductor (Shanghai) Co., Ltd., Second Office Action, CN 202011359780.0, Jun. 24, 2021, 8 pgs.
Yibu Semiconductor (Shanghai) Co., Ltd., English Translation of Second Office Action, CN 202011359780.0, Jun. 24, 2021, 14 pgs.
Yibu Semiconductor (Shanghai) Co., Ltd., CN Decision to Grant, CN 202011359780.0, Aug. 19, 2021, 4 pgs.
Yibu Semiconductor (Shanghai) Co., Ltd., English Translation of CN Decision to Grant, CN 202011359780.0, Aug. 19, 2021, 3 pgs.

* cited by examiner

METHOD OF FORMING CHIP PACKAGE HAVING STACKED CHIPS

CROSS REFERENCE TO RELATED APPLICATIONS

This application claims the benefit of priority under the Paris Convention to Chinese Patent Application No. CN202011352638.3, filed Nov. 27, 2020, entitled "Package and Method of Forming the Same," Chinese Patent Application No. CN202011352636.4, filed Nov. 27, 2020, entitled "Package and Method of Forming a Package," and Chinese Patent Application No. CN202011359780.0, filed Nov. 27, 2020, entitled "Package and Method of Forming the Same," each which is incorporated by reference herein in its entirety. This application is related to co-pending U.S. patent application Ser. No. 17/535,985, entitled "Chip Package and Method of Forming Chip Packages," filed on even date herewith, U.S. patent application Ser. No. 17/535,984, entitled "Chip Package and Method of Forming," filed on even date herewith, each which is incorporated by reference herein in its entirety.

FIELD OF THE INVENTION

The present application relates to the technical field of semiconductors, in particular to a chip package and a method of forming chip packages.

BACKGROUND

As the functions of semiconductor integrated circuits are ever increasing, and the computation speed gets faster and faster, more and more investment is made in the development of chip stacking technology to find more effective solutions. Wafer Level Packaging (WLP) is the technology of packaging an integrated circuit while it is still part of a wafer, in contrast to the more conventional method of slicing the wafer into individual circuits (dice) and then packaging them. WLP allows integration of wafer fab, packaging, test, and burn-in at wafer level in order to streamline the manufacturing process undergone by a device from silicon start to customer shipment. Current WLP technology, however, does not allow chip-stacking. Thus, in conventional chip stacking technology, stacking is mostly carried out in final assembly, and vertical connection between stacked chips needs to be realized using technologies such as Through Silicon Via (TSV), Through Glass Via (TGV), Through Mold Via (TMV), or Wire-bond (Wire-bond). As a result, the packaging process of conventional chip-stacking techniques is complicated and costly.

SUMMARY

In some embodiments, a chip package comprises a stack of chip layers including at least a first chip layer and a second chip layer, each chip layer in the stack of chip layers having a front side and a back side, the front side of the second chip layer facing the back side of the first chip layer. The first chip layer includes at least one first chip having first chip contacts on the front side of the first chip layer. The second chip layer includes at least one second chip having second chip contacts on the front side of the second chip layer. The stack of chip layers further includes one or more chip connectors, the one or more chip connectors including at least one first chip connector in the first chip layer. The at least one first chip connector has through vias. At least a first subset of the through vias being coupled to respective ones of the second chip contacts. The chip package further includes a redistribution layer formed on the front side of the first chip layer, whereby the first chip contacts and the first connector contacts are coupled to the redistribution layer, and the second chip contacts are coupled to the redistribution layer via the first subset of the through vias.

In some embodiments, the stack of chip layers is encapsulated in a molding compound.

In some embodiments, the one or more chip connectors includes at least one first chip connector in the first chip layer, the at least one first chip connector having first connector contacts, second connector contacts, and through holes between respective ones of the first connector contacts and respective ones of the second connector contacts, the second chip contacts of the second chip are soldered to respective ones of at least a first subset of the second connector contacts of the at least one first chip connector.

In some embodiments, the one or more chip connectors include active and/or passive coupling devices.

In some embodiments, a respective second chip in the second chip layer is stacked on a respective first chip in the first chip layer and offset from the respective first chip such that an edge portion of the respective second chip protrudes beyond a corresponding edge of the respective first chip. At least some of the second chip contacts are disposed in the edge portion of the respective second chip.

In some embodiments, the stack of chip layers further includes a third chip layer, the front side of the third chip layer facing the back side of the second chip layer, the third chip layer including at least one third chip having third chip contacts on the front side of the third chip layer. A respective third chip in the third chip layer is stacked on a respective second chip in the second chip layer and offset from the respective second chip such that an edge portion of the respective third chip protrudes beyond a corresponding edge of the respective second chip At least some of the third chip contacts are disposed in the edge portion of the respective third chip.

In some embodiments, the one or more chip connectors further includes at least one second chip connector in the second chip layer, the at least one second chip connector having third connector contacts coupled to a second subset of the second connector contacts, fourth connector contacts coupled to respective ones of the third chip contacts, and through vias between respective ones of the third connector contacts and respective ones of the fourth connector contacts.

In some embodiments, a chip packaging method comprises forming a stack of chip layers including at least a first chip layer and a second chip layer, each chip layer in the stack of chip layers having a front side and a back side, the front side of the second chip layer facing the back side of the first chip layer. The first chip layer including a plurality of first chips having first chip contacts on the front side of the first chip layer. The second chip layer including a plurality of second chip having second chip contacts on the front side of the second chip layer. The stack of chip layers further including chip couplers, the chip couplers including a first plurality of chip couplers in the first chip layer, the first plurality of chip couplers having through vias. At least a first subset of the through vias being coupled to respective ones of the second chip contacts;

In some embodiments, the chip packaging method further comprises forming a redistribution layer on the front side of the first chip layer, whereby the first chip contacts and the first coupler contacts are coupled to the redistribution layer and the second chip contacts are coupled to the redistribution layer via the first subset of the through vias. The chip packaging method further comprises dividing the stack of chip layers and the redistribution layer to form a plurality of chip packages. A package of the plurality of packages including at least one first chip from the first chip layer, at least one second chip from the second chip layer, one or more chip connectors, and a singulated redistribution layer, the one or more chip connectors including one or more chip couplers and/or one or more chip coupler segments.

In some embodiments, the carrier substrate is a semiconductor wafer.

In some embodiments, the chip couplers include active and/or passive coupling devices.

In some embodiments, forming a stack of chip layers includes sequentially forming a plurality of chip layers over a carrier substrate, including assembling the first chip layer on the front side of the second chip layer with the back side of first chip layer facing the front side of the second chip layer; encapsulating the stack of chip layers in a molding compound; removing a portion of the molding compound to expose the front side of the first chip layer, on which the redistribution layer is subsequently formed; and removing the carrier substrate.

In some embodiments, assembling the first chip layer on the front side of the second chip layer includes assembling a first chip of the first chip layer on one or more second chips of the second chip layer and assembling one or more chip couplers of the first chip layer on one or more second chips of the second chip layer.

In some embodiments, sequentially forming a plurality of chip layers over a carrier substrate further includes, before assembling the first chip layer, assembling the second chip layer on the front side of a third chip layer with the back side of the second chip layer facing the front side of the second chip layer.

The embodiments described herein realize the stacking of the chips by using chip connector and a one-stop WLP process, without using the technology of vertically connecting the chips using TSVs and the like in the functional chips. Thus, the complexity and manufacturing cost of the three-dimensional multi-layer chip package is reduced.

The foregoing description is only an overview of the technical solutions of the present invention, and the embodiments of the present invention are described below in order to make the technical means of the present invention more clearly understood and to make the above and other objects, features, and advantages of the present invention more clearly understandable.

BRIEF DESCRIPTION OF THE DRAWINGS

The above and other objects, features and advantages of exemplary embodiments will become readily apparent from the following detailed description read in conjunction with the accompanying drawings. Several embodiments are illustrated by way of example, and not by way of limitation, in the figures of the accompanying drawings and in which the same or corresponding reference numerals indicate the same or corresponding parts.

DETAILED DESCRIPTION OF THE EMBODIMENTS

The following disclosure provides various embodiments, or examples, for implementing various features or solutions. Specific examples of components and arrangements are described below to simplify the present disclosure. These are, of course, merely examples and are not intended to limit the invention. For example, in the following description, forming a first feature over or on a second feature may include embodiments in which the first and second features are formed in direct contact, and may also include embodiments in which additional features may be formed between the first and second features, such that the first and second features may not be in direct contact. Further, the present invention may repeat reference numerals and/or characters in the various embodiments. This repetition is for the purpose of simplicity and clarity and does not in itself dictate a relationship between the various embodiments and/or configurations discussed.

Figure 1:
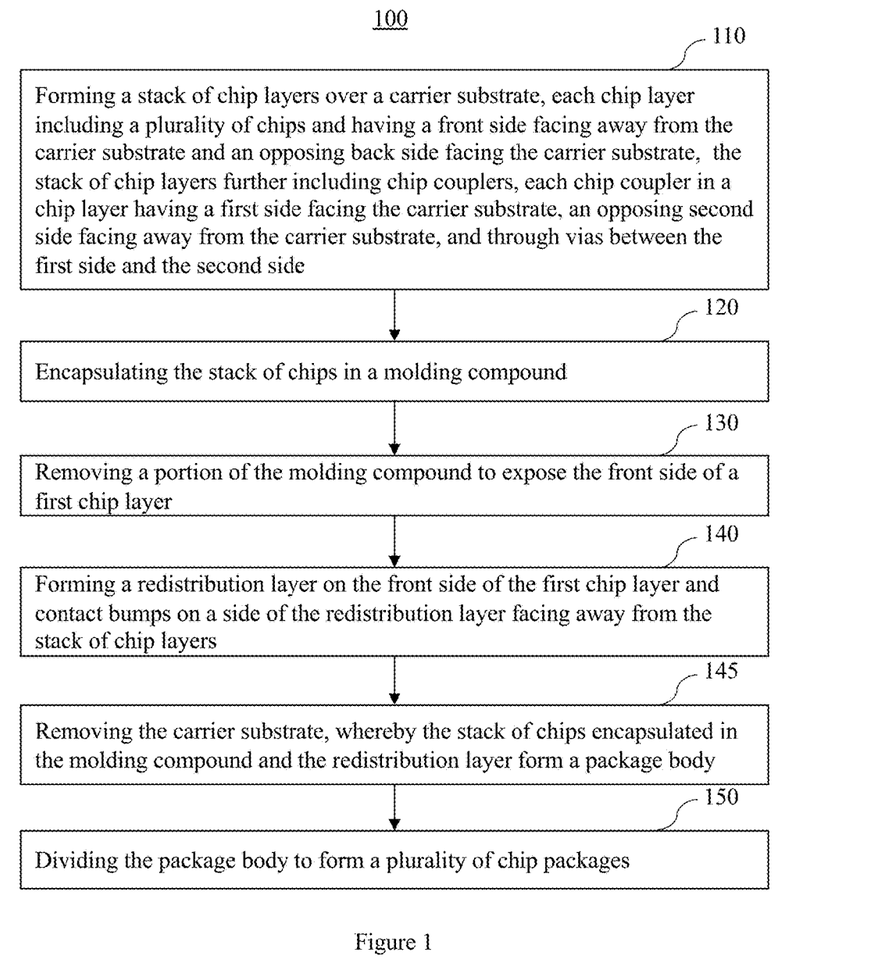
FIG. 1 shows a flow diagram of a method for forming a package according to some embodiments.

FIG. 1 shows a flow diagram illustrating a method 100 of forming a package according to an embodiment. The method 100 comprises: Step 110, in which a stack of chip layers is formed on a carrier or carrier substrate. Each chip layer includes a plurality of chips and has a front side facing away from the carrier substrate and an opposing back side facing the carrier substrate. The stack of chip layers further includes chip couplers. Each chip coupler in a chip layer has a first side facing the carrier substrate, an opposing second side facing away from the carrier substrate, and through vias extending from the first side to the second side. The method 100 further comprises Step 120, in which a molding process is performed to encapsulate the stack of chip layers in a molding compound; Step 130, in which the molding compound is thinned (e.g., a portion of the molding compound is removed by, for example, grinding or polishing), to expose the front side of a first chip layer 1; Step 140, in which a redistribution or rewiring layer is formed on the exposed front side of the first chip layer 1 and, afterwards, solder bumps are formed on a side of the redistribution layer facing away from the stack of chip layers; Step 145, in which the carrier is removed; and Step 150, in which the stack of chips together with the redistribution layers is divided (or singulated) to form a plurality of packages.

In some embodiments, the carrier is a high surface flatness component, and at least one chip layer may be stacked on the carrier. After the molding process is performed on the chip layer, a molded package structure may be formed on the carrier. In some embodiments, the material used for the molding process may include solid or liquid molding materials starting from epoxy resins, organic polymers, or other compounds with or without silicon-based or glass fillers.

In some embodiments, the step of removing the carrier, the step of adding the rewiring layer and the bumps, and the step of dividing the package body are steps known in Wafer Level Packaging (WLP).

Various embodiments of the present invention will be described below based on the above-described method and with reference to various figures.

FIGS. 2A-2C and 3 to 4 show schematic cross-sectional views, layout views and perspective views of various stages a package being formed in process for forming a package according to some embodiments.

Figure 2A:
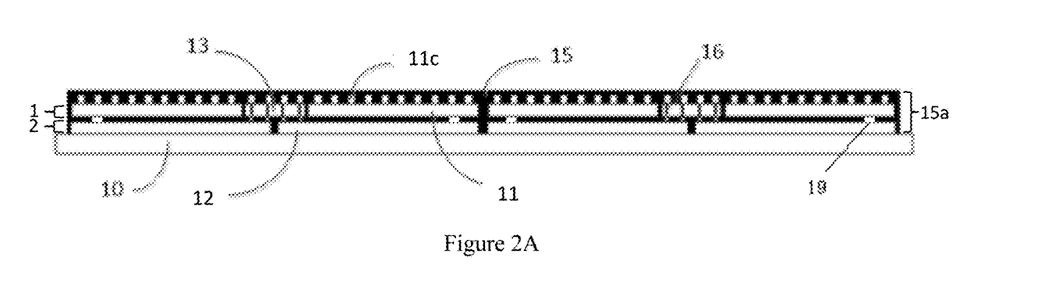
FIGS. 2A-2C and 3 to 4 show schematic cross-sectional views, layout views and perspective views of various stages a package being formed in process for forming a package according to some embodiments.

As shown in FIG. 2A, after performing steps 110 and 120, a stack of (e.g., two) chip layers are placed and assembled on a carrier 10. The stack of chip layers including a first chip layer 1 over a second chip layer 2 over the carrier 10. The first chip layer 1 includes a plurality of first chips 11 and a plurality of chip couplers 13. The second chip layer 2 includes a plurality of second chips 12. In some embodiments, the first chip layer 1 is assembled on the second chip layer 2. In some embodiments, each chip coupler 13 is assembled on two second chips 12, while each first chip 11 is assembled on a corresponding second chips 12. Each chip 11, 12 includes a front side and a back side. In the art, a surface having, for example, contact pads or bumps (e.g., contacts pad or bumps 11c on the first chips 11, as shown in FIG. 2A) is considered a front surface. In some embodiments, the first chip 11 and the second chip 12 are placed with its front side facing up, i.e., away from the carrier 10. As shown in FIG. 2A, the stack of chip layers are molded in a molding compound 15 to form an encapsulated structure 15a.

Figure 2B:
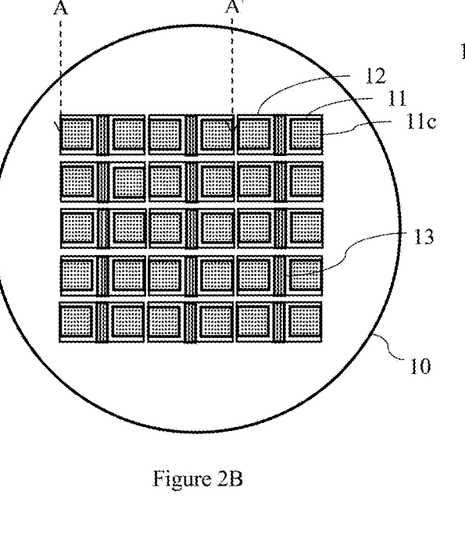

FIG. 2B is a layout view of the first and second chip layers on the carrier 10, with dashed line A-A' indicating where the cross-section of FIG. 2A is taken. As shown in FIG. 2B, the second chips 12 may be first placed on the carrier 10 or over one or more other chip layers at their respective positions. The second chips 12 are spread horizontally across a flat surface of the carrier 10.

In some embodiments, a chip layer can be formed such that each chip is flanked on all four sides or edges by four chip couplers, respectively, so as to accommodate more I/O contacts on the chips.

Figure 2C:
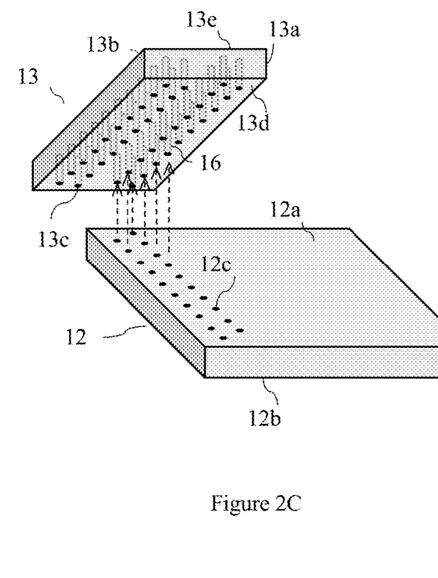

After the second chip layer 2 is formed, each first chips 11 may be placed and assembled on one or more corresponding second chips 12 and each chip connectors 13 may be placed and assembled on one or more second chips 12. FIG. 2C is a perspective view of a chip coupler 13 and a second chip 12 showing the placing and assembling of the chip coupler 13 on the second chip 12. As shown in FIG. 2C, the front surface 12a of the second chip 12 has contact pads or bumps 12c arranged proximate to an edge 12e of the second chip 12. As also shown in FIG. 2C, in some embodiments, the chip coupler 13 has four edges (including a left edge 13a, a right edge 13b), a first (bottom) side or surface 13d and a second (top) side or surface 13e. The chip coupler 13 further includes first contact pads or bumps 13c on the bottom surface 13d. second contact pads or bumps 13c on the top surface 13e, and through vias 16 coupling respective first contact pads to respective bottom contact pads.

As shown by the dashed arrows in FIG. 2C, forming the stack of chips may include aligning and coupling (electrically and/or mechanically) the contact pads of bumps 12c on the front side of chip 12 to corresponding contacts 13c on the bottom surface 13d of chip coupler 13. In some embodiments, the contact pads of bumps 12c on the front side of chip 12 are coupled to corresponding contacts 13c on the bottom surface 13e of chip coupler 13 using a soldering process. In some embodiments, each of the chip couplers 13 is placed and assembled on one or more second chips 12 with at least a subset of the chip coupler contacts 13c on a bottom surface 13d mechanically and electrically coupled to respective contact pads or bumps 11c, 12c on each of the one or more second chips 12 by, for example, soldering.

Herein, a chip connector 13 may be used to electrically couple different electronic devices, including, for example, various devices such as chips, redistribution layers, and other chip connectors; the electronic device to which the chip connector is coupled is typically not in the same chip layer as the chip connector. In some embodiments, the chip couplers may be made of a material such as glass or silicon. In some embodiments, the chip couplers may be active or passive coupling devices. For example, the chip coupler may have several through holes 16 in the vertical direction. The via 16 may be filled with a conductive material to form conductive vias. In some embodiments, conductive traces may be provided on both the upper and lower surfaces of the chip connector to electrically couple different vias on one surface.

Adhesive dots (adhesive dots) or spacers may also be provided between the different chip layers, such as adhesive dots 19 shown in FIG. 2A. The adhesive dots serve to separate and secure the different chip layers. In some embodiments, the adhesive dots are made of a non-conductive medium. In some embodiments, adhesive dots may be omitted.

Figure 3:
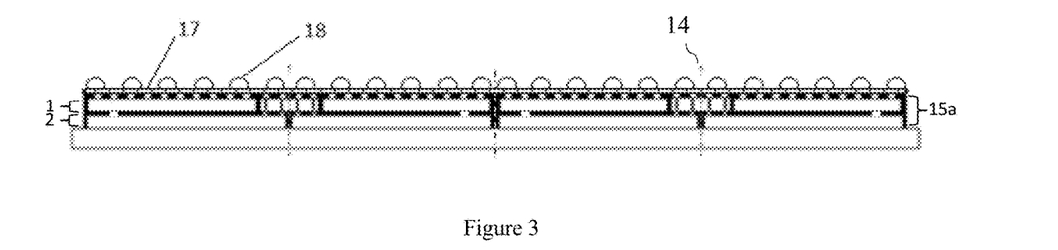

FIG. 3 shows a package main body after steps 130 and 140 are performed. As shown in FIG. 3, the encapsulated structure may be thinned, or a portion of the molding compound 25 is removed by, for example, grinding or polishing, to exposed chip contacts 11c and chip coupler contacts 13c on the front side of the first chip layer 1. Thereafter, a redistribution or rewiring layer 17 may be formed on the front side of the first chip layer 1. Bumps 18 may then be formed on a side of the rewiring layer 17 facing away from the stack of chips, resulting in a package main body shown in FIG. 3.

Figure 4:
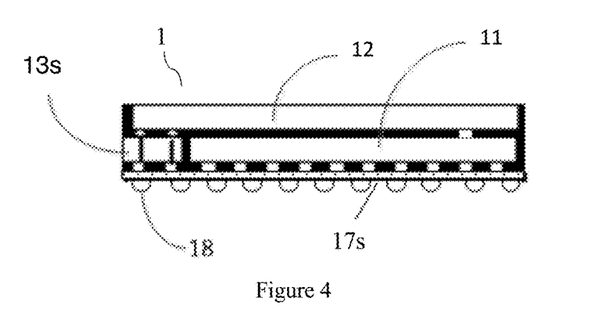

FIG. 4 shows a package 1 formed after performing steps 145 and 150, when the carrier 10 is removed and the remaining package main body is divided along the broken line shown 14 in FIG. 3 to form a plurality of packages, including the package 1 shown in FIG. 4. As shown, the package 1 includes a singulated redistribution layer 17s, a stack of chips coupled to the singulated redistribution layer 17s, and one or more (e.g., two) first chip connector devices 13s having respective through vias. The stack of chips includes one or more first chips 11 and one or more second chips 12. A respective first chip 11 of the one or more first chips has a front side facing the singulated redistribution layer 17s and respective first chip contacts on the front side of the respective first chip and coupled to the singulated redistribution layer 17s. A respective second chip 12 of the one or more second chips has a front side facing the first chip and respective second chip contacts on the front side of the respective second chip. The respective second chip contacts are coupled to the singulated redistribution layer 17s via at least some of the respective through vias 16 in the one or more first chip connector devices 13s.

In some embodiments, the one or more first chip connector devices 13s in the package 1 include at least one chip coupler 13 and/or at least one chip coupler segment from the first plurality of chip couplers. For example, as the mold structure is divided by, for example, cutting along lines 14 after the carrier 10 is removed, a chip coupler 13 may be segmented into two chip coupler segments, one in each of the packages on two sides of a cut line 14, and each chip coupler segment can be a chip connector device 13s. Note that the broken lines shown in FIG. 3 are merely schematic, and the package main body is not divided only along the broken lines shown in FIG. 3.

Figure 5:
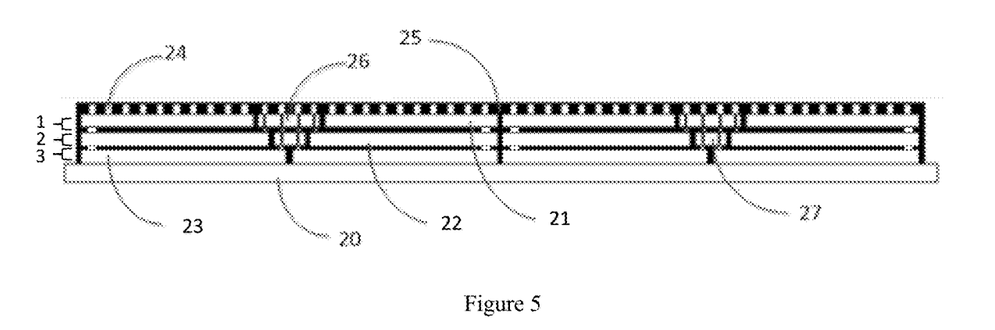
FIGS. 5 to 7 show schematic cross-sectional views of a package being formed in a process for forming a package according to some embodiments.
Figure 6:
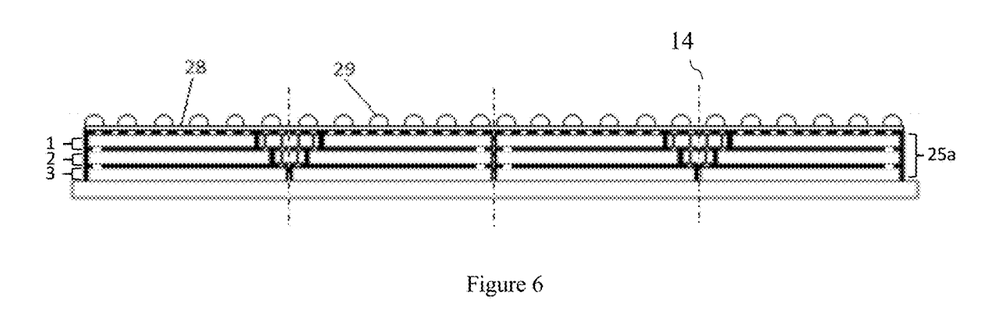
Figure 7:
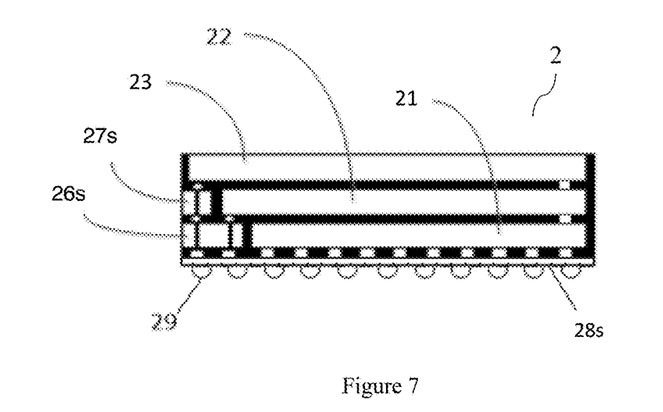

FIG. 5 to 7 show schematic cross-sectional views of a package at different stages of a process for forming the package according to some embodiments.

As shown in FIG. 5, three chip layers are formed on a carrier 20. The first chip layer 1 includes a plurality of first chips 21 and a plurality of first chip couplers 26. The second chip layer 2 includes a plurality of second chips 22 and a plurality of second chip couplers 27. The third chip layer 3 includes a plurality of third chips 23. In some embodiments, as shown in FIG. 5, the first chip layer 1 and the second chip layer 2 on the carrier 10 have been molded, thereby forming an encapsulated structure 25a.

In some embodiments, the plurality of third chips 23 are first placed on the carrier 10, then the plurality of second chips 22 and the plurality of second chip couplers 27 on the plurality of third chips 23, and finally the plurality of first chips 21 and the plurality of first chip connectors 26 on the plurality of second chips 22 and the plurality of second chip connectors 27. In some embodiments, the first chips 21, the second chips 22, and the third chip 23 are placed face up (e.g., with the front side facing away from the carrier).

In some embodiments, the package structure as shown in FIG. 5 may comprise one or more second chip layers. Each of the one or more second chip layers includes a plurality of second chips and a plurality of second chip couplers. Thus, one or more second chip couplers may be stacked to form a chip coupler stack with the first chip coupler 33. In some embodiments, in a chip coupler stack, the area of a top surface or bottom surface of a chip coupler in one chip layer may be different from the area of a top surface or bottom surface of a chip coupler in a different chip layer. For example, as shown in FIG. 5, the chip coupler 27 stacked with the chip coupler 26 has a smaller horizontal size than the chip coupler 26. In this way, portions of the chip coupler 26 would protrude beyond the left and right edges of the chip coupler 27 to allow coupling of the second chips 22 on the left and right sides of the chip coupler 27 to some of the vias in the chip coupler 26. In some embodiments, the three chip layers are molded in a molding compound 25 to form a plastic encapsulated structure.

FIG. 6 shows a package main body after steps 130 and 140 are performed. As shown in FIG. 7, the plastic encapsulated structure 25 may be thinned, or a portion of the molding compound 25 is removed by, for example, grinding or polishing, to expose the chip contacts 11c and chip coupler contacts 13c on the front side of the first chip layer 1, and a redistribution or rewiring layer 28 may be formed on the front side of the first chip layer 1. Bumps 29 may then be formed under the rewiring layer 28.

FIG. 7 shows a package 2 after performing steps 145 and 150, when the carrier 20 is removed and the remaining package main body 25 is divided along the broken line shown 14 in FIG. 6 to form a plurality of packages, including the package 2 shown in FIG. 7. As shown, the package 2 includes a singulated redistribution layer 28s, a stack of chips coupled to the singulated redistribution layer 28s, and one or more chip connector stacks. The stack of chips includes one or more first chips 21, one or more second chips 22, and one or more third chips 23. The one or more chip connector stacks including stacked chip connector devices (e.g., first connector device 26s and second connector device 27s) having respective through vias. A respective first chip 21 of the one or more first chips has a front side facing the singulated redistribution layer 28s and respective first chip contacts on the front side of the respective first chip and coupled to the singulated redistribution layer 28s. A respective second chip 22 of the one or more second chips has a front side facing the one or more first chips and respective second chip contacts on the front side of the respective second chip. The respective second chip contacts are coupled to the singulated redistribution layer 28s via at least some of the respective through vias in the one or more first chip connector devices 26s. A respective third chip 23 of the one or more third chips has a front side facing the one or more second chips and respective third chip contacts on the front side of the respective third chip. The respective third chip contacts are coupled to the singulated redistribution layer 28s via at least some of the through vias in the one or more second chip connector devices 27s and some of the through vias in the one or more first chip connector devices 26s.

In some embodiments, a first chip connector device 26s may be a segment of a first chip coupler 26, and a second chip connector device 27s may be a segment of a second chip coupler 27. In some embodiments, the package 2 may include a segmented first chip coupler, at least one segmented second chip coupler, a third chip, at least one second chip, and a first chip.

In some embodiments, conductive traces (not shown) may be provided on, for example, the top surface of a first chip connector device 26s, to allow the third chip 23 be electrically coupled to the at least one second chip 22 in the package 2 through the at least one second chip connector device 27s and the first chip connector device 26s. The third chip may be further electrically coupled to the first chip through at least one second chip connector device 27s, the first chip connector device 26s, and the singulated redistribution layer 28s. The at least one second chip may be electrically coupled to the first chip through the first chip connector device 26s and the singulated redistribution layer 28s, or the at least one second chip may be electrically coupled to the first chip through the at least one second chip connector device 27s, the first chip connector device 26s, and the singulated redistribution layer 28s.

In various embodiments of the present invention, the individual chips may be coupled to various circuit structures outside the package using not only chip connectors and/or redistribution layers, but also chip connectors and/or redistribution layers and bumps.

As is well known to those skilled in the art, the contacts or bumps may be made of a conductive material or solder, including Cu, Ni, Au, Ag, etc., or other alloy materials, as well as other materials. In some embodiments, the contacts or bumps may have the form of pads, but may have other possible forms.

The foregoing has outlined features of several embodiments so that those skilled in the art may better understand the various aspects of the present invention. Those skilled in the art should appreciate that they may readily use and devise other arrangements and structures that are designed to carry out the same purposes and/or achieve the same advantages of the embodiments described herein as a basis for the present invention. Those skilled in the art should also realize that such equivalent constructions do not depart from the spirit and scope of the present disclosure, and that they may make various changes, substitutions, and alterations herein without departing from the spirit and scope of the present disclosure.

Also, spatially relative terms, such as "below . . . ," "below . . . ," "lower," "above . . . ," "upper," "above . . . ," and the like, may be used herein for ease of description to describe one element or component's relationship to another element or component (or elements) as illustrated. Spatially relative terms are intended to encompass different orientations of the device in use or operation in addition to the orientation depicted in the figures. The device may be otherwise oriented (rotated 90 degrees or at other orientations) and the spatially relative descriptors used herein interpreted accordingly. In addition, herein, the term "assembly" refers to the implementation of circuit coupling between the various electronic devices. The term "chip" may refer to various types of chips, such as logic chips, storage chips, and the like.

It will be understood that, although the terms first, second, etc., are, in some instances, used herein to describe various elements, these elements should not be limited by these terms. These terms are only used to distinguish one element from another. For example, a first UV lamp could be termed a second UV lamp, and, similarly, a second UV lamp could be termed a first UV lamp, without departing from the scope of the various described embodiments. The first widget and the second widget are both widget, but they are not the same condition unless explicitly stated as such.

The terminology used in the description of the various described embodiments herein is for the purpose of describing particular embodiments only and is not intended to be limiting. As used in the description of the various described embodiments and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

The foregoing description, for purpose of explanation, has been described with reference to specific embodiments. However, the illustrative discussions above are not intended to be exhaustive or to limit the scope of the claims to the precise forms disclosed. Many modifications and variations are possible in view of the above teachings. The embodiments were chosen in order to best explain the principles underlying the claims and their practical applications, to thereby enable others skilled in the art to best use the embodiments with various modifications as are suited to the particular uses contemplated.

What is claimed is:

1. A chip packaging method, comprising:
   forming a stack of chip layers, the stack of chip layers including at least a first chip layer and a second chip layer, each chip layer in the stack of chip layers having a front side and a back side, the front side of the second chip layer facing the back side of the first chip layer, the first chip layer including a plurality of first chips having first chip contacts on the front side of the first chip layer, the second chip layer including a plurality of second chips having second chip contacts on the front side of the second chip layer, the stack of chip layers further including chip couplers, the chip couplers including at least a first plurality of chip couplers in the first chip layer, the first plurality of chip couplers having first through vias, at least a first subset of the first through vias being coupled to respective ones of the second chip contacts;
   forming an encapsulated structure including the stack of chip layers encapsulated in a molding compound, with the first chip contacts on the front side of the first chip layer exposed on one side of the encapsulated structure;
   forming a redistribution layer on the one side of the encapsulated structure where the first chip contacts are exposed to form a package body, whereby the first chip contacts and the first through vias are electrically coupled to the redistribution layer; and
   dividing the package body to form a plurality of chip packages, a chip package of the plurality of chip packages including at least one first chip from the first chip layer, at least one second chip from the second chip layer, one or more chip connectors, and a singulated portion of the redistribution layer, the one or more chip connectors including one or more chip couplers and/or one or more chip coupler segments.

2. The method of claim 1, wherein forming a stack of chip layers includes assembling the stack of chip layers on a carrier substrate, and wherein the carrier substrate is a semiconductor wafer, the method further comprising: removing the carrier substrate before dividing the package body.

3. The method of claim 1, wherein the chip couplers include active and passive coupling devices and each of the first through vias is through silicon or glass.

4. The method of claim 1, wherein forming a stack of chip layers includes:
   sequentially forming a plurality of chip layers over a carrier substrate, including forming the second chip layer over the carrier substrate with the back side of the second chip layer facing the carrier substrate and assembling the first chip layer on the front side of the second chip layer with the back side of first chip layer facing the front side of the second chip layer.

5. The method of claim 4, further comprising removing the carrier substrate after forming the redistribution layer and before dividing the package body to form the plurality of chip packages.

6. The method of claim 4, wherein assembling the first chip layer on the front side of the second chip layer includes assembling each first chip of the first chip layer on one or more second chips of the second chip layer and assembling the first plurality chip couplers of the first chip layer on the plurality of second chips.

7. The method of claim 4, wherein sequentially forming a plurality of chip layers over a carrier substrate further includes, before forming the second chip layer over the carrier substrate, assembling a third chip layer over the carrier substrate, and wherein the second chip layer is formed on the front side of the third chip layer with the back side of the second chip layer facing the front side of the third chip layer, wherein the third chip layer is formed over the carrier substrate with the front side of the third chip layer facing away from the carrier substrate, the third chip layer including a plurality of third chips having third chip contacts on the front side of the third chip layer, and wherein the package of the plurality of packages further includes at least one third chip from the third chip layer, and wherein the chip couplers further includes a second plurality of chip couplers in the second chip layer, the second plurality of chip couplers having second through vias, at least a subset of the second through vias being respective coupled between the third chip contacts and a second subset of the first through vias.

8. The method of claim 7, wherein an edge portion of a respective third chip in the third chip layer protrudes beyond a corresponding edge of the respective second chip in the second chip layer, and wherein a respective portion of the third chip contacts are disposed in the edge portion of the respective third chip and respectively coupled to a corresponding portion of the subset of the second through vias.

9. The method of claim 1, wherein an edge portion of a respective second chip in the second chip layer protrudes beyond a corresponding edge of a respective first chip in the first chip layer, wherein at least part of a respective chip coupler of the chip couplers is assembled on the edge portion of the respective second chip, and wherein a corresponding portion of the second chip contacts are disposed in the edge portion of the respective second chip and respectively coupled to corresponding through vias in the respective chip coupler.

10. The method of claim 1, wherein forming the encapsulated structure includes encapsulating the stack of chip layers in the molding compound and removing a portion of the molding compound to expose the first chip contacts on the front side of the first chip layer.

11. The method of claim 1, wherein each of the chip couplers includes glass or silicon and each of the first through vias is through glass or silicon, wherein dividing the package body to form the plurality of chip packages includes segmenting at least some of the chip couplers into chip coupler segments.

12. The method of claim 1, wherein each of the chip couplers includes a layer of glass or silicon and each of the first through vias is through the layer of glass or silicon.

13. The method of claim 1, wherein forming the stack of chip layers includes assembling the plurality of first chips and the first plurality of chip couplers on the second chip layer, wherein each of the plurality of first chips is assembled on a corresponding second chip in the second chip layer, and wherein a first portion of a respective chip coupler of the first plurality of chip couplers is assembled on an edge portion of a respective second chip in the second chip layer and a second portion of the respective chip coupler is assembled on an edge portion of another second chip in the second chip layer.

14. A chip packaging method, comprising:
forming a stack of chip layers, the stack of chip layers including at least first chips in a first chip layer, second chips in a second chip layer, and chip couplers, the chip couplers including at least first chip couplers in the first chip layer, each respective first chip of the first chips having respective first chip contacts on a front side of the respective first chip, each respective second chip of the second chips having respective second chip contacts on a front side of the respective second chip, the front side of the respective first chip and the front side of the respective second chip face a same direction, each respective chip coupler having respective through vias, the respective second chip contacts being respectively coupled to at least a first subset of the through vias of one or more of the first chip couplers;
forming an encapsulated structure including the stack of chip layers encapsulated in a molding compound, with the first chip contacts of the plurality of first chips exposed on one side of the encapsulated structure;
forming a redistribution layer on the one side of the encapsulated structure to form a package body, whereby the first chip contacts of the plurality of first chips and the through vias of the first chip couplers are electrically coupled to the redistribution layer; and dividing the package body to form a plurality of chip packages, a chip package including at least one first chip, at least one second chip, a singulated portion of the redistribution layer, and the one or more chip connectors, each of the one or more chip connectors being a chip coupler or a segment of a chip coupler.

15. The method of claim 14, wherein forming a stack of chip layers includes assembling the stack of chip layers on a carrier substrate, and wherein the carrier substrate is a semiconductor wafer, the method further comprising: removing the carrier substrate before dividing the package body.

16. The method of claim 15, wherein forming a stack of chip layers includes:
sequentially forming a plurality of chip layers over the carrier substrate, including forming the second chip layer over the carrier substrate with the front side of each of the second chips facing away from the carrier substrate and assembling the first chips and the first chip couplers on the second chip layer with the front side of each of the first chips facing away from the second chip layer.

17. The method of claim 16, wherein sequentially forming a plurality of chip layers over a carrier substrate further includes, before forming the second chip layer over the carrier substrate, forming a third chip layer over the carrier substrate, and wherein the second chip layer is assembled over the third chip layer, wherein the third chip layer includes third chips, each respective third chip of the third chips having respective third chip contacts on a front side of the respective third chip facing away from the carrier substrate, and wherein the package of the plurality of packages further includes at least one third chip from the third chip layer, and wherein the chip couplers further includes second chip couplers in the second chip layer, the respective third chip contacts being coupled to the redistribution layer through at least one of the second chip couplers and at least one of the first chip couplers.

18. The method of claim 14, wherein forming the encapsulated structure includes encapsulating the stack of chip layers in the molding compound and removing a portion of the molding compound to expose the first chip contacts of the first chips on the front side of the first chip layer.

19. The method of claim 14, wherein each of the chip couplers includes a layer of glass or silicon and each of the through vias is through the layer of glass or silicon.

20. The method of claim 14, wherein forming the stack of chip layers includes assembling the first chips and the first chip couplers on the second chip layer, wherein each of the first chips is assembled on a corresponding one of the second chips, and wherein a first portion of a respective chip coupler of the first chip couplers is assembled on an edge portion of a respective second chip in the second chip layer and a second portion of the respective chip coupler is assembled on an edge portion of another second chip in the second chip layer.

* * * * *